US008049557B2

(12) United States Patent
Georges Putzeys

(10) Patent No.: US 8,049,557 B2
(45) Date of Patent: Nov. 1, 2011

(54) SELF OSCILLATING CLASS D AMPLIFICATION DEVICE

(75) Inventor: Bruno Johan Georges Putzeys, Rotselaar (BE)

(73) Assignee: Hypex Electronics B.V., Groningen (NL)

( * ) Notice: Subject to any disclaimer, the term of this patent is extended or adjusted under 35 U.S.C. 154(b) by 0 days.

(21) Appl. No.: 12/656,815

(22) Filed: Feb. 17, 2010

(65) Prior Publication Data
US 2011/0068864 A1    Mar. 24, 2011

(30) Foreign Application Priority Data

Feb. 18, 2009  (NL) ..................................... 1036600
Jun. 22, 2009  (EP) ..................................... 09008173

(51) Int. Cl.
H03F 3/38    (2006.01)
H03F 1/36    (2006.01)
(52) U.S. Cl. .......................................... 330/10; 330/107
(58) Field of Classification Search .................. 330/10, 330/107, 207 A; 332/109
See application file for complete search history.

(56) References Cited

U.S. PATENT DOCUMENTS

| | | | | |
|---|---|---|---|---|
| 6,127,885 | A * | 10/2000 | Colangelo | 330/10 |
| 2005/0083114 | A1 | 4/2005 | Risbo | |
| 2006/0008095 | A1 | 1/2006 | Tsuji | |
| 2008/0238543 | A1 | 10/2008 | Koch | |

FOREIGN PATENT DOCUMENTS

JP    56039606    4/1981

OTHER PUBLICATIONS

Dutch Search Report and Written Opinion mailed Aug. 26, 2009 in Dutch Application No. 103660.

* cited by examiner

*Primary Examiner* — Steven J Mottola
(74) *Attorney, Agent, or Firm* — Davidson Berquist Jackson & Gowdey, LLP

(57) ABSTRACT

An amplification device, comprising a device input receiving a device input signal, an amplifier unit comprising a zero crossing detector unit, an output filter and a lead-lag compensation network. The zero crossing detector unit compares the device input signal with a reference potential and switches a pulse width modulated detector output signal between first and second voltage levels dependent on the comparison. The amplifier unit provides an actual device output signal, e.g., an amplified representation of the device input signal. The amplification device further comprises a device output providing the actual device output signal, a control loop bridging the amplifier unit and comprising a forward filter, e.g., an integrating filter, for increasing loop gain improving the signal-to-noise ratio of the actual device output signal, and a deviation detection unit detecting over modulation of the amplifier unit, so that the amplification device disables forward filter functioning upon over modulation.

11 Claims, 6 Drawing Sheets

SELF OSCILLATING CLASS D AMPLIFICATION DEVICE

FIELD OF THE INVENTION

The present invention is aimed at an amplification device, comprising a device input for receiving a device input signal, an amplifier unit comprising a zero crossing detector unit, an output filter and a lead-lag compensation network, said zero crossing detector unit being arranged for comparing said device input signal with a reference potential and switching a pulse width modulated detector output signal between a first voltage level and a second voltage level dependent on said comparison, wherein said amplifier unit is arranged for providing as an actual device output signal an amplified representation of said device input signal, and said amplification device comprising a device output for providing said actual device output signal.

BACKGROUND OF THE INVENTION

Pulse width modulation is a technique that can be used for converting an analogue signal into a binary signal, by comparing the analogue signal with a periodic reference signal. Pulse width modulation is amongst others applied in class D amplifiers, which are often used in portable audiovisual appliances. Class D amplifiers are known for their relatively high power efficiency (energy losses are small), and relatively straightforward circuit design. This allows these amplification devices to be small, and makes them suitable for portable applications. Class D amplifiers are based on the principle that an incoming signal is compared with a periodic reference signal, such as a saw tooth or triangle wave. The amplification device comprises a switched amplifier which switches between a first and second voltage level dependent on whether the input voltage is higher or lower than the reference voltage than the voltage level of the reference signal.

The output of this switched amplifier is a high-frequency square wave with varying duty cycle. Prior to delivery to the load, this signal is first low-pass filtered by an LC low pass filter. The low pass filter prevents the fast on/off portion of the signal from reaching the load, while passing the average value without attenuation.

An amplifier constructed in this manner suffers from various imperfections. The first and second voltage levels are normally not stable and affect the overall gain dynamically. The switched output stage takes a finite time to switch from the first to second voltage levels and back, and the output state is uncertain during this interval. This manifests itself in harmonic distortion. Moreover, the LC output filter, as seen from the load, constitutes a parallel resonant circuit that has a high output impedance near the cut-off frequency of the filter. A low output impedance is desirable to make the frequency response of the amplifier independent of the load impedance.

These problems are most efficiently addressed using feedback error control. Apart from improving the reproduction quality of a class D amplifier, the feedback loop can also be advantageously used to cause a controlled oscillation, thus operating the amplifier in a self-oscillating mode, obviating the need to provide an external periodic reference signal, e.g. provided by a triangle wave oscillator.

High order control loops having at least one amplitude-limited state variable usually have several stable limit cycles (oscillation conditions) or "modes". In linear (i.e. non-switching) systems, operation at any of these limit cycles is considered "instability". In switching systems, intentional operation at one of these modes is called "self-oscillation". In particular, self-oscillation can be applied in class D amplifiers as a means of significantly increasing their loop gain. Since in a self-oscillating class D amplifier it is no longer necessary to provide a periodic reference signal, the design may be simplified considerably.

Self-oscillating control loops only work well when operating in one particular mode, usually the highest frequency mode. Operation at another mode will either result in greatly deteriorated performance or may even be destructive. Self-oscillation is achieved by closing a suitable feedback loop around a zero crossing detector, i.e. around for example a class D amplifier.

The oscillation modes of a self-oscillating class D amplifier are usually calculated using the following two criteria, which are based on the Barkhausen criterium for sinewave oscillators:

$$Arg(H(j \cdot 2 \cdot \pi \cdot f))=0 \qquad \text{(Eq. 1a)}$$

and $$d(Arg(H(j \cdot 2 \cdot \pi \cdot f)))/df<0 \qquad \text{(Eq. 1b)}$$

wherein H(s) is the loop function of the oscillation loop and f is the frequency. What this formula basically says is that the system can oscillate at a frequency where the phase shift of the loop is $2\pi$ (or 0) radians. These criteria settle at several frequencies, also known as modes of operation.

High order loop control entails several problems. Firstly, when an amplifier containing one or multiple integrators is overmodulated (clipped), the error between input and output is large. The integrators will keep integrating this error for the entire time the output spends in clip. Once the input signal returns to the normal range, the output remains clipped until the integrated error becomes zero again. Recovery from clipping therefore happens rather slowly, causing a distortion in the output signal that lasts until the circuit is fully recovered.

Secondly, in view of the Barkhausen criterium a loop may be potentially capable of oscillating at unwanted frequencies. This is will almost certainly happen when the loop is optimised for maximum loop gain. A designer then counts on gain margin (the surplus gain over unity in a loop magnitude response being greater than unity when the phase difference is at (multiples of) $2\pi$), not phase margin, to prevent the circuit from oscillating at unwanted frequencies. However, when a high order control loop is clipped, gain margin effectively collapses giving the circuit the opportunity to oscillate at a lower (unstable) frequency mode.

Thirdly, a control loop has only enough degrees of freedom for a designer to fix either the closed loop response (out of which the open loop response follows) or the open loop response (out of which the closed loop response follows) but not both. The normal procedure in class D amplifiers is to design for loop gain and to correct the frequency response externally.

SUMMARY OF THE INVENTION

The present invention has for its object to alleviate the above-mentioned problems, and to provide a stable self-oscillation driven amplification device, based on a zero crossing detector unit.

These and other objects are achieved by the present invention in that there is provided an amplification device, comprising: a device input for receiving a device input signal; an amplifier unit comprising a zero crossing detector unit, an output filter and a lead-lag compensation network, said zero crossing detector unit being arranged for comparing said device input signal with a reference potential and for switching a pulse width modulated detector output signal between a first voltage level and a second voltage level dependent on said comparison, wherein said amplifier unit is arranged for providing an actual device output signal said actual device output signal being an amplified representation of said device input signal; and a device output for providing said actual device output signal; wherein said amplification device further comprises a control loop placed around said amplifier unit and comprising a forward filter for increasing loop gain for improving a signal-to-noise ratio of said actual device output signal, said forward filter comprising an integrating filter; and a deviation detection unit arranged for detecting overmodulation of said amplifier unit; wherein said amplification device is arranged for disabling the functioning of said forward filter for said amplification device upon occurrence of overmodulation of said amplifier unit.

In the device of present invention, the functioning of forward filter for the amplification device is disabled as soon as the amplifier unit is overmodulated. In particular, upon occurrence of overmodulation the forward filter ceases its normal operation such as to prevent contributing to maintaining the effects of overmodulating. This may be achieved in a number of different manners. The forward filter may for example be saturated such as to cease any integration of a large disturbance. Alternatively, the forward filter may switch itself into a mode wherein it does not provide a meaningful or significant contribution to the amplification unit. For example, this can be achieved by disabling the integrator function, or disabling the forward filter function, or by switching off the whole control loop. Another option is to reduce the integrator gain to a level wherein its contribution is small or not meaningful, or by suppressing or reducing an input signal to said integrator. In that case, the amplifier unit of the amplification device is left only or primarily responding to a device input signal, while the control loop merely or mainly provides a DC component (which is ideally as small as possible) or no signal at all. This enables fast recovery from clipping.

Since the closed loop response of the amplification device is independent from the transfer function of the forward filter, the closed loop response and the open loop response can be fixed independently from each other. The frequency response of the amplification device only depends on the transfer function of the amplifier unit, while the loop gain depends only on the forward filter response, resolving the design issues substantiated above for prior art class D amplifier designs.

According to an embodiment of the invention, the deviation detection unit comprises a detection filter arranged for receiving the device input signal, and for modifying this device input signal such as to provide an expected device output signal corresponding to the actual device output signal of the amplifier unit, preferably but not essentially without imperfections. In particular, the expected device output signal resembles the output from the amplifier unit without clipping, or with clipping at a higher voltage level. This enables detection of a deviation between the actual device output signal of the amplifier unit and the expected device output signal from the deviation detection unit.

According to a further embodiment, the detection unit or the control loop is arranged for comparing the expected device output signal with the actual device output signal, and for providing an error signal upon deviation of the expected device output signal from the actual device output signal. This may simply be embodied by injecting the expected device output signal into the control loop, e.g. by means of a subtraction unit wherein the expected device output signal is subtracted from the actual device output signal received through the control loop, or vice versa.

The forward filter is dimensioned such as to saturate upon providing a forward filter output signal in response to said received error signal, having a voltage level that exceeds the saturation threshold. This saturation threshold may be arbitrarily chosen, but may also be chosen as small as possible such as to respond to clip efficiently. In this respect, however, it is noted that for achieving the desired functionality it is not required or essential that the saturation threshold is minimal, however it does provide the additional advantage of efficient response to clipping. It is also noted that the function of the forward filter is to improve the signal-to-noise ratio (wherein 'noise' in the present meaning may comprise distortions), since it improves the overall loop gain. Therefore, a certain amount of tolerance of the forward filter towards the small signal received at the input thereof may be desirable, in order to prevent the forward filter from saturating too quickly. Once the forward filter is saturated, the control loop no longer contributes to the loop gain.

The input signal received at the device input is not only provided to the deviation detection unit, but is also provided to the amplifier unit for normal operation. According to an embodiment, the output of the forward filter is combined with the input signal received at het device input and is used as an input signal to the amplifier unit. The means for combining the input signal from the device input with the output signal of the forward filter may comprise an additional unit as will be understood by the skilled person.

According to a further embodiment of the present invention, the zero crossing detector may comprise a correction feedback loop for reducing disturbance caused by the comparator. In addition to the above, it is noted that the present invention provides a convenient and straightforward means of controlling the occurrence of clipping in self-oscillating class D amplifiers. The resulting circuit design is relatively plain and elegant and may therefore be kept small. In particular, the deviation detection circuit, which is to mimic the behaviour of the amplifier unit of the invention, may simply comprise a further amplifier unit. A plain RC circuit may do well, but alternatives may also be considered. A further amplifier circuit based on a further zero crossing detector, which is set to clip at a higher voltage level, may also work, although this is from a viewpoint of simplicity not the most preferred solution. This further amplification unit is then only used for error detection and not for amplification purposes as such.

The integrator of the forward filter may be dimensioned such as to saturate at the first onset of an error signal to be received, completely blocking operation of the control loop, leaving the amplification unit to operate in its own, one remaining oscillating mode. Operation in this one oscillation mode is stable. The main amplifier unit quickly recovers, without the effect of the high order control loop to sustain the overmodulation.

According to a second aspect, the invention is directed to an amplification device, comprising: a device input for receiving a device input signal; an amplifier unit comprising a zero crossing detector unit arranged for comparing said device input signal with a reference potential and for switching a pulse width modulated detector output signal between a first voltage level and a second voltage level dependent on said comparison, wherein said amplifier unit is arranged for providing an actual device output signal, said actual device output signal being an amplified representation of said device input signal; and a device output for providing said actual device output signal; wherein said amplification device further comprises a control loop placed around said amplifier unit and comprising a forward filter for increasing loop gain for improving a signal-to-noise ratio of said actual device output signal, said forward filter comprising an integrating filter; and a deviation detection unit arranged for detecting overmodulation of said amplifier unit; wherein said amplification device is arranged for reducing the functioning of said forward filter for said amplification device upon occurrence of overmodulation of said amplifier unit detected by said deviation detection unit.

According to a third aspect, the present invention provides a method of amplifying a device input signal for providing an actual device output signal being an amplified representation of said device input signal by means of an amplification device, said method comprising the steps of: a device input receiving said device input signal; an amplifier unit comprising a zero crossing detector unit performing a step of comparing said device input signal with a reference potential and for switching a pulse width modulated detector output signal between a first voltage level and a second voltage level dependent on said comparison; said amplifier unit providing said actual device output signal to a device output; said method further comprising the steps of: a control loop increasing loop gain for improving a signal-to-noise ratio of said actual device output signal, wherein said control loop is placed around said amplifier unit and comprises a forward filter, said forward filter comprising an integrating filter; a deviation detection unit providing an error signal to said amplification device upon detecting overmodulation of said amplifier unit providing; and said amplification device reducing or disabling the functioning of said forward filter for said amplification device upon occurrence of overmodulation of said amplifier unit detected by said deviation detection unit.

In addition to the above, it is noted that the teachings of the invention are not limited to only one control loop. Higher order systems, comprising several integrating units and control loops, may be operated using the teachings of the present invention, by applying the expected device output signal to each of the integrating units and causing each of them to saturate upon clipping.

BRIEF DESCRIPTION OF THE DRAWINGS

The invention will further be described by means of specific, non-limiting, embodiments thereof with reference to the enclosed drawings, wherein.

DETAILED DESCRIPTION OF THE DRAWINGS

Figure 1:
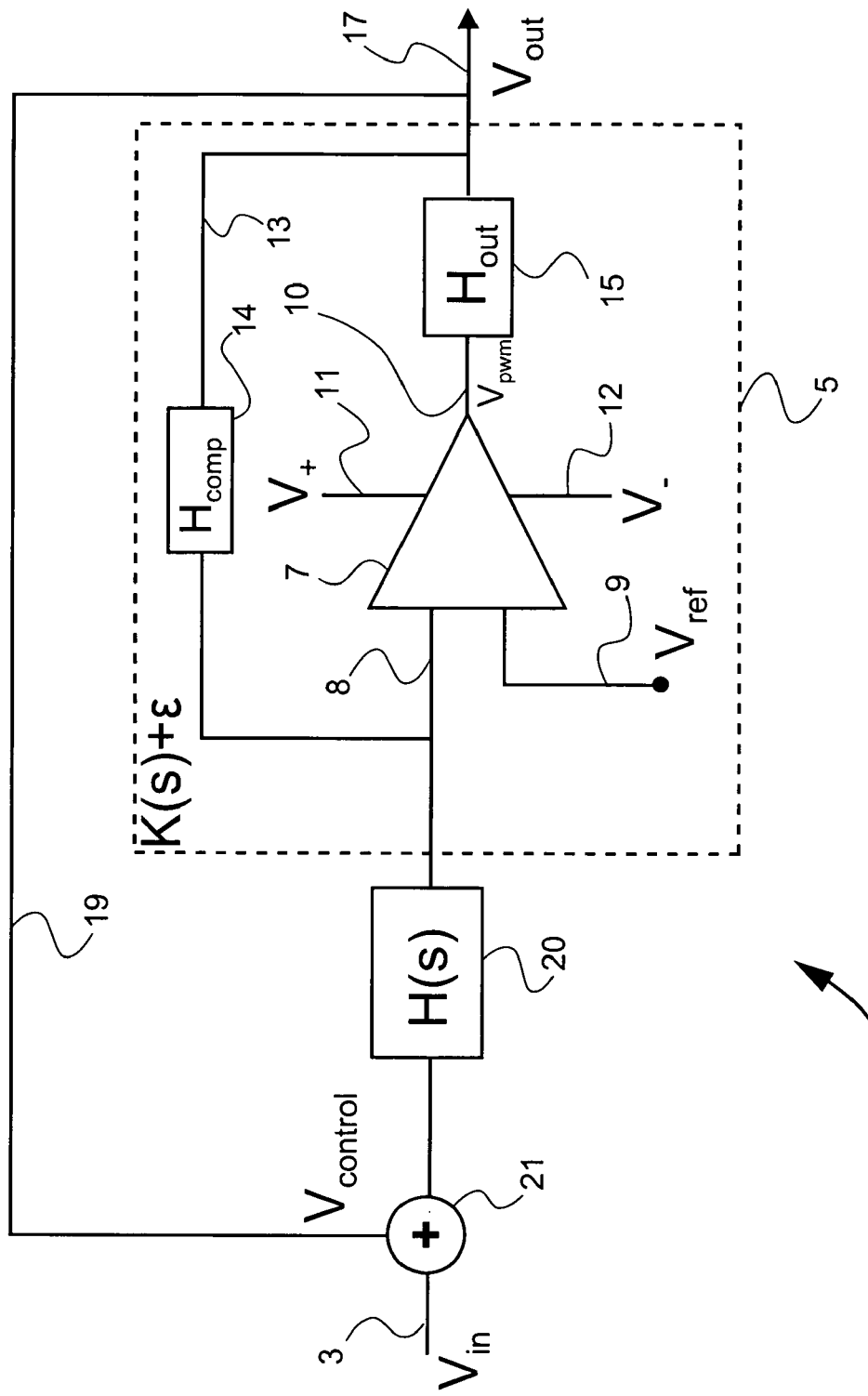
FIG. 1 illustrates a high order controlled self-oscillation class D amplifier device known from prior art.

In FIG. 1 there is shown a high order controlled self-oscillating class D amplification device 1 according to prior art. In this illustration the device comprises an amplifier unit 5 which is based on a zero crossing detector unit, and comprises a comparator 7 and an output filter 15. Comparator 7 receives an incoming signal 8 which is compared to a reference signal $V_{ref}$ 9. Lead-lag compensation loop 13 is placed around comparator 7 and output filter 14. The lead-lag compensation loop 13, with filter $H_{comp}$ 14, together with low-pass filter 15 and the propagation delay of comparator 7, enables the amplifier unit 5 to operate in a self oscillating mode. Since the amplification device 1 is self-oscillating, the reference signal $V_{ref}$ usually will be a DC signal, in particular a reference potential, usually ground. Although it is under regular conditions and common applications not expected to be contributive, the skilled person has the liberty to use any arbitrary reference signal, not necessarily ground as a fixed potential, and not necessarily a DC signal.

If the voltage level of incoming signal 8 is above the voltage level of $V_{ref}$, comparator 7 on output 10 provides a signal at voltage level $V_+$. If the voltage level of incoming signal 8 is smaller than the voltage level of $V_{ref}$ 9, a voltage level $V_-$ is provided at output 10. The voltage levels for switching ($V_+$, $V_-$) are provided to comparator 7 via inputs 11 and 12, i.e. the supply voltages of the final stage of comparator 7, which is also the power stage of the amplification device. A pulse width modulated (PWM) signal $V_{pwm}$ is thereby provided at the output of the comparator 7. Output filter 15 converts this PWM signal into output signal $V_{out}$, which is an amplified representation of the input signal $V_{in}$. $V_{out}$ may for example be provided to a speaker (not shown) as audio output.

From output 17, a control loop 19 feeds the output signal $V_{out}$ back to the beginning of the loop and adds this signal via adder 21 to the device input $V_{in}$ of input 3. The loop comprises a forward filter 20 with transfer function H(s). Forward filter 20 may be any suitable type of filter that increases the order of the loop by at least one. Forward filter 20 may for example be an integrator. The function of integrating forward filter 20 is to improve the loop gain by integrating the noise signal thereby increasing the signal-to-noise ratio.

Amplifier unit 5 has a transfer function K(s), but adds a disturbance indicated by ϵ to the output signal. The error term ϵ is no part of the transfer function, as the skilled person will appreciate. The error term ϵ will also be present in the control signal $V_{control}$ which is integrated by forward filter 20. Under normal conditions, this error term does not lead to instabilities in the oscillation frequency of the loop (i.e. the loop tending to shift towards a lower oscillation mode). However, a problem arises when amplifier unit 5 is overmodulated and the error term ϵ becomes large.

The amplification device is said to be overmodulated when the duty cycle of the PWM output signal reaches either 0% or 100%. In that case, the input signal is too strong for the device to convert it into a meaningful PWM signal. If the input is above the maximum allowed level, the PWM duty cycle will be at 100%, and $V_{out}$ will be fixed at its maximum level. When the amplifier unit 5 is overmodulated and the system is clipping, a relatively large error term in the output signal $V_{out}$ is fed back via control loop 19 towards adding unit 21 where it is added (with a phase difference) to the input signal device input 3. Forward filter 20 makes the situation worse by integrating the error prior to applying it via input 8 to comparator 7. The clipping condition is thereby sustained and it takes a long time for the device to recover.

Figure 2A:
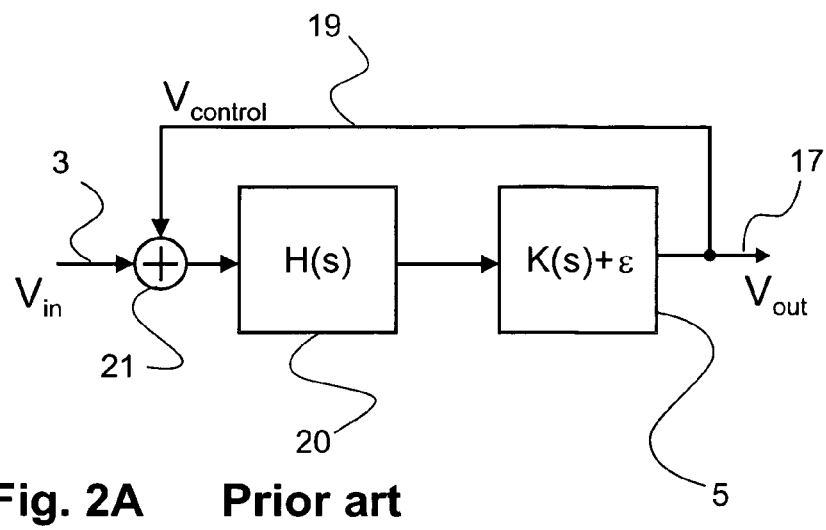
FIG. 2A discloses schematically the same amplifier device as FIG. 1.
Figure 2B:
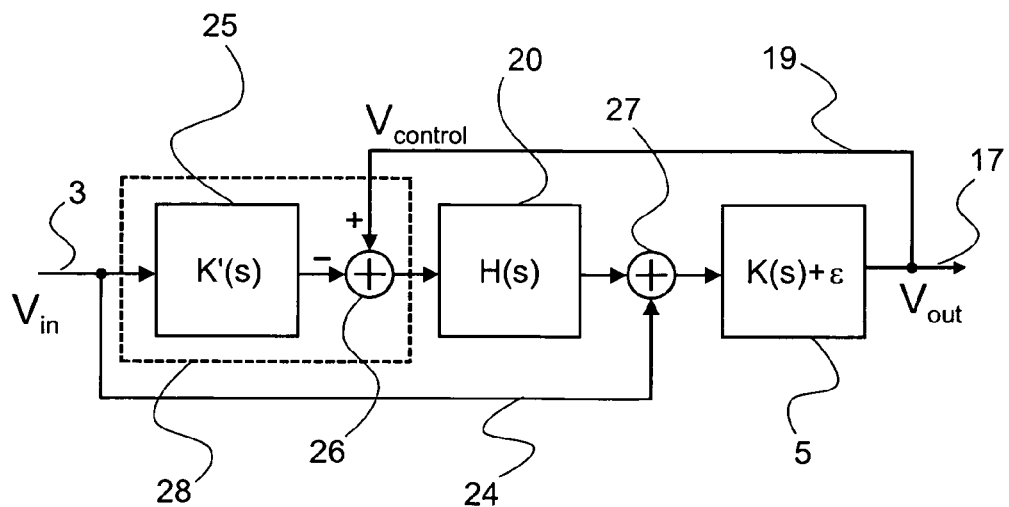
FIG. 2B discloses a high order controlled self oscillating class D amplifier device according to the present invention.
Figure 4:
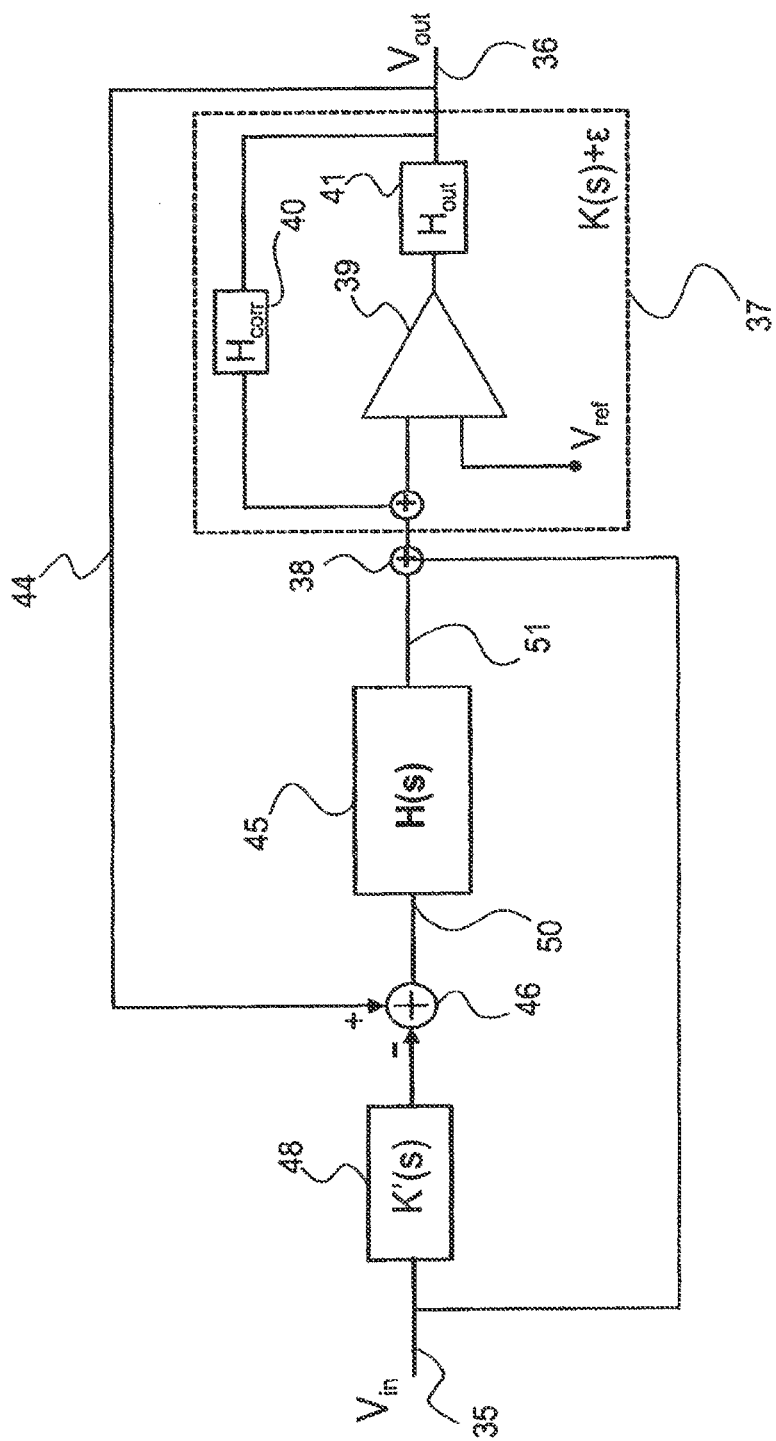
FIG. 4 discloses a further embodiment of the present invention.

FIG. 2B illustrates an amplification device according to the present invention. For comparison, FIG. 2A illustrates schematically the amplification device of FIG. 1 wherein for purposes of clarity, components have been replaced by filter units. The invention is best understood by comparing FIGS. 2A and 2B in the light of the description hereinbelow. Note however that the embodiment of FIG. 2B is to be interpreted as merely an embodiment, and alternatives are possible such as illustrated in FIG. 4, falling within the scope of the present invention.

In FIG. 2A forward filter unit 20 and amplifier unit 5 are illustrated with their transfer functions H(s) and K(s) respectively. Amplifier unit 5 adds a disturbance ϵ to the output signal. The device input 3 receiving input signal $V_{in}$ is combined with the control signal from the control loop 19 in adding unit 21, and is applied to forward filter 20. After filtering, the signal is applied to amplifier unit 5, providing the actual device output signal $V_{out}$ at the device output 17. This actual device output signal $V_{out}$ is fed back via control loop 19 and offered as control signal $V_{control}$ to adding unit 21, for combination with input signal $V_{in}$ of device input 3.

In FIG. 2B, the input signal $V_{in}$ is led via connection 24 to adding unit 27 where it is combined with the signal coming from forward filter 20, and provided to amplifier unit 5. Just as described above in relation to FIGS. 1 and 2A, amplifier unit 5 has a transfer function K(s) and adds a (usually small) disturbance ϵ to the actual output signal $V_{out}$. The actual device output signal $V_{out}$ enters control loop 19 from device output 17 back towards adding unit 26. The control loop 19, with forward filter 20, significantly improves the loop gain of the amplification device illustrated in FIG. 2B. The lead-lag compensation 14, together with zero-crossing detector 7 and output filter Hout creates a self-oscillating amplification unit 5 with a well-defined gain and frequency response K(s). The oscillation mode for self-oscillation is the highest possible frequency causing a phase difference of 2π (i.e. 0) radians.

In the amplification device of the present invention, a deviation detection unit 28 contains detection unit 25 having a transfer function K'(s). This detection unit receives input signal $V_{in}$ from device input 3. Since transfer function K'(s) mimics or simulates the transfer function K(s) of amplifier unit 5 at the output of detection filter 25, the signal is an idealized version of $V_{out}$ without the error term ϵ. Subtraction unit 26 subtracts the output signal from detection filter 25 from the signal received via control loop 19. Therefore, forward filter 20 only receives the disturbance ϵ, i.e. the difference between the signal received via the control loop 19 and the signal received from detection filter 25. The disturbance ϵ is under normal conditions considered small, and therefore the output of forward filter 20 will be small as well. Detection unit 25 may be implemented as a straightforward RC filter.

When amplification device 1 is overmodulated, the duty cycle of the PWM output signal has reached its limits, and no longer provides a meaningful representation of the voltage level of the input signal $V_{in}$. As a result the error term ϵ becomes relatively large. Therefore, the difference between the signal received through control loop 19 deviates from the signal received through detection filter 25 to a relatively large extent. The relatively large error term ϵ is received by forward filter 20.

In accordance with an embodiment, forward filter 20 is dimensioned such that it will saturate relatively quickly upon receipt of an error signal ϵ which is on average stronger than an error signal ϵ that is received under normal conditions. Therefore, as soon as the amplification device 1 is overmodulated and starts clipping, since ϵ becomes large, forward filter 20 H(s) saturates and will no longer contribute to the input signal provided to the amplifier unit 5. In particular, saturation causes the output of filter 20 to provide a continuous DC component (which is ideally as small as possible). Therefore, the effect of the control loop is destroyed and the amplification device operates as a lower order system. The input signal received by amplifier unit 5 contains only device input signal $V_{in}$ as a variable component. Therefore, since the control loop does not contribute during saturation of forward filter 20, the undesired effect of sustaining the clipping effect is not present in an amplification device of the present invention. The device quickly recovers from overmodulation.

The embodiment described above uses saturation in order to disable the effect of the control loop 19. The skilled person may appreciate that in general, the invention is directed to inhibiting normal operation of the integrating control loop as soon as disturbance represented by error signal ϵ becomes too large. This may be implemented by saturating the forward filter, but also by means of disabling the loop or its effect or by limiting or fixing its output. As an alternative to the embodiment described above, the skilled person may appreciate that the error signal ϵ may be used to drive a switch, e.g. in the form of a transistor, that disables the effect of the control loop. This may for example be designed by closing a short circuit that resets the forward filter 20 at the moment that ϵ becomes too large. In that case, integration of error term ϵ does not occur. Alternatively, the effect of control loop 19 with forward filter 20 may be disabled by using error signal ϵ to drive a transistor into conduction such that a connection is closed between the input of forward filter 20 and ground. In this case, forward filter 20 will no longer receive an input signal as soon as overmodulation in the amplifier unit 5 occurs.

In general, and unlike the criterium used in prior art systems which is described herein above in the prior art section, the following exact equation precisely predicts the oscillation frequency as a function of the duty cycle:

$$\begin{cases} \text{Arg}\left(\lim_{\delta \to 0^-} \sum_{n=0}^{\infty} \frac{(1-e^{n \cdot j \cdot 2 \cdot \pi \cdot h}) \cdot (1-e^{n \cdot j \cdot 2 \cdot \pi \cdot (1-h)})}{2 \cdot n} \cdot \frac{1}{H(n \cdot j \cdot 2 \cdot \pi \cdot f) \cdot e^{\delta \cdot n \cdot j \cdot f}}\right) = 0 \\ \frac{d\left(\text{Arg}\left(\lim_{\delta \to 0^-} \sum_{n=0}^{\infty} \frac{(1-e^{n \cdot j \cdot 2 \cdot \pi \cdot h}) \cdot (1-e^{n \cdot j \cdot 2 \cdot \pi \cdot (1-h)})}{2 \cdot n} \cdot \frac{1}{H(n \cdot j \cdot 2 \cdot \pi \cdot f) \cdot e^{\delta \cdot n \cdot j \cdot f}}\right)\right)}{df} < 0 \end{cases} \quad \text{(Eq. 2)}$$

In the above formula, h is the duty cycle.

Figure 3A:
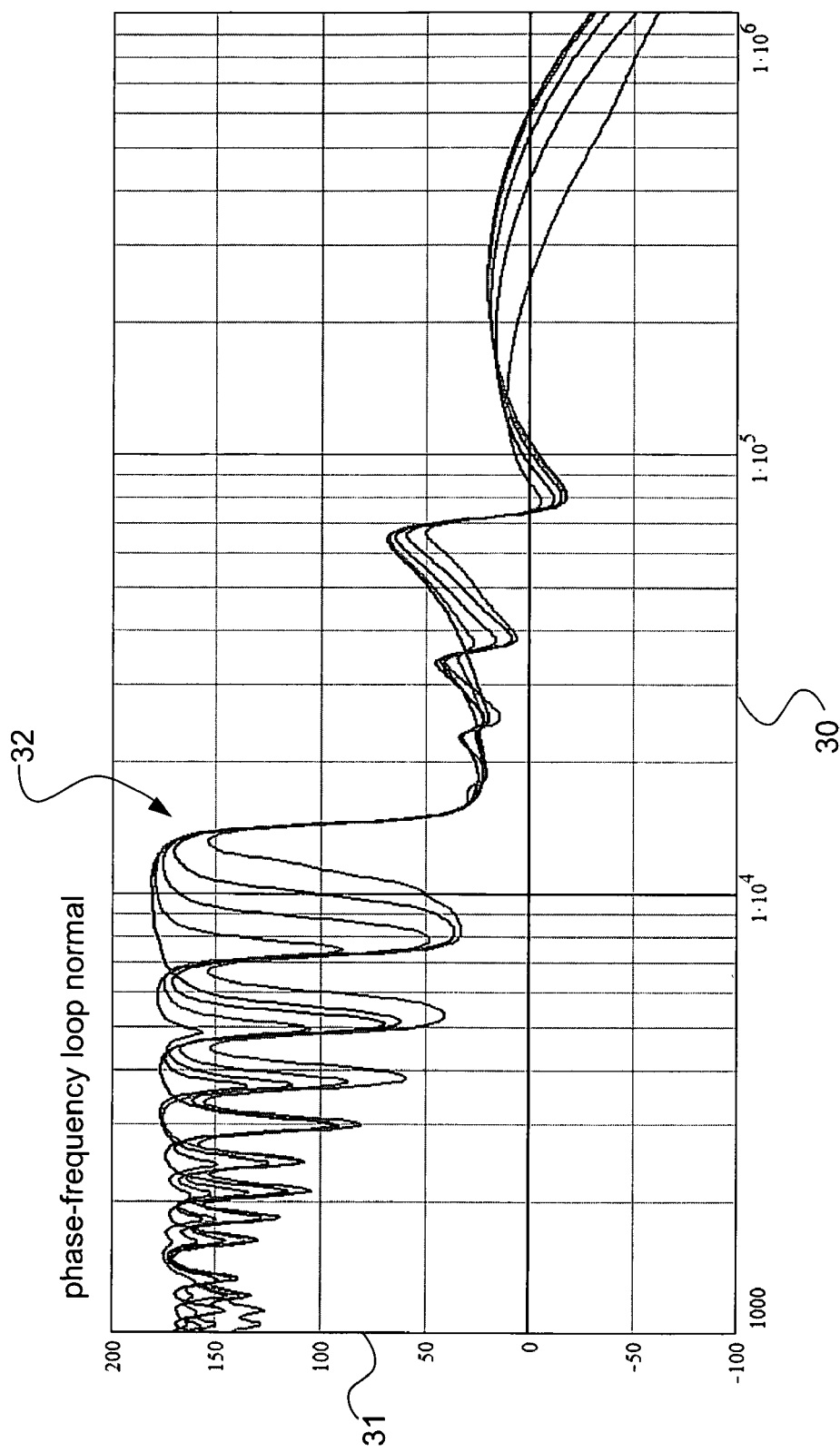
FIG. 3A discloses the phase-frequency plot of a device according to the present invention under normal conditions.
Figure 3B:
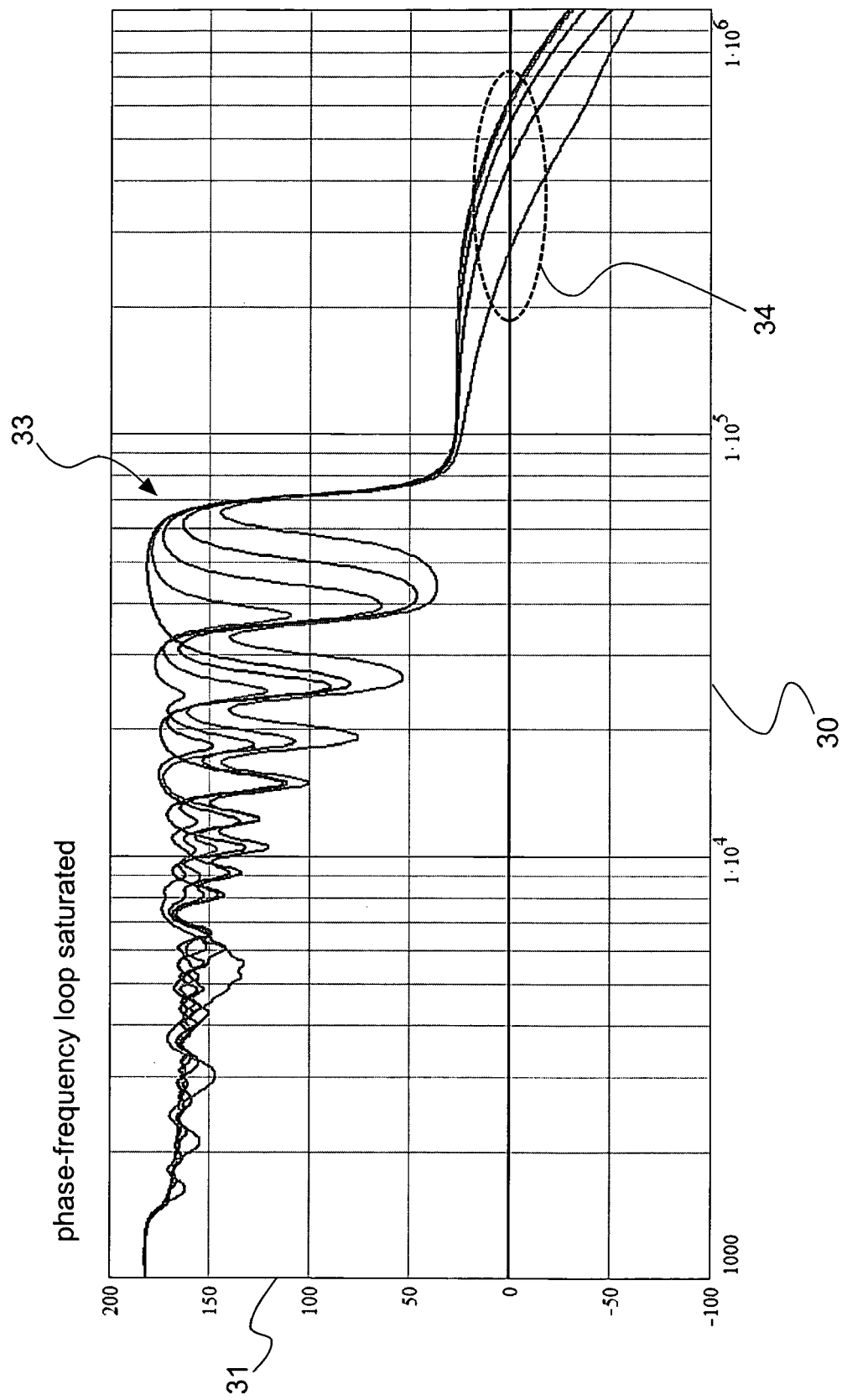
FIG. 3B discloses a phase-frequency plot of a device according to the present invention during saturation.

FIGS. 3A and 3B illustrate the phase-frequency plot of an amplification device under normal conditions (FIG. 3A) and under saturated conditions (FIG. 3B). In both FIGS. 3A and 3B, reference numeral 30 indicates the frequency axis and reference numeral 31 indicates the phase axis. The frequency axis has a logarithmic scale The phase-frequency response of the device is dependent on the duty cycle of the signal. Therefore, both FIGS. 3A and 3B contain multiple phase-frequency curves 32 and 33 for different duty cycles.

FIG. 3A illustrates the left hand side of the first of two equations in the above-mentioned formulae, which corresponds to the behaviour of the amplification device of the present invention under normal conditions (when the forward filter is not saturated or disabled).

Upon saturation, FIG. 3B shows the phase-frequency plot of the amplification device and it is clear that it only contains one oscillation solution (duty cycle dependent) which is given by 34 for different duty cycles. Therefore, upon saturation, the amplification device is clearly forced to operate in a self-oscillatory mode since this is the only stable mode available to the system.

FIG. 4 discloses an embodiment of the present invention. The FIGS. 5A through 5C have been added in order to illustrate a number of alternative implementations of forward filter 45 of the present invention. Each of the alternative and specific components may be implemented in the circuit design individually, independently or in combination, replacing or embodying the specific units and components schematically illustrated in FIG. 2B. Although FIGS. 4 and 5A through 5C disclose the combinations of specific units, the embodiments of these figures are not intended to limit the scope of the invention. For example, the detection filter unit 48 may be implemented as any specific electronic unit that simulates operation of amplification unit 37 under regular (i.e. no overmodulation) conditions. The amplifier unit 37 may be any type of self-oscillating class D amplifier unit.

In FIG. 4, amplifier unit 37 comprises an output filter $H_{out}$ 41 which for example may be embodied as a low pass filter. A lead-lag compensation loop comprising compensation filter 40 with transfer function $H_{comp}$ is added to the circuit design in order to force unit 37 into a self-oscillating mode of operation and to obtain a defined response K(s). Amplifier unit 37 is based on a switched type comparator unit 39 that receives the input signal $V_{in}$, and compares it to a reference signal $V_{ref}$. $V_{ref}$ may simply be a DC-signal, and is usually ground. At the output of comparator 39 there is provided a pulse width modulated signal that switches between two voltage levels dependent on whether the voltage level of $V_{in}$ is higher, or lower than the voltage level of $V_{ref}$.

The actual device output signal $V_{out}$ is provided to loop 44 and forward filter 45. Summing unit 46 receives the device output $V_{out}$ and an improved or idealized version of the output signal $V_{out}$, from detection filter 48. In fact, detection filter 48 may be a copy of the circuit design of amplifier unit 37, although a regular RC based filter may be sufficient and may be preferred in view of simplicity of the design. Summing unit 46 provides of error term $\epsilon$ to forward filter 45.

Since upon overmodulation of amplifier unit 37 the disturbance $\epsilon$ will be large, the signal on input 50 of forward filter 45 may be used for inhibiting regular operation of integrating forward filter 45, in accordance with the invention. Filter 45 may be designed such as to drive the forward filter 45 into saturation. Feedback loop 44 is thereby blocked as a result of saturation of unit 45, and the only variable component present in the signal at the input of amplifier unit 37 (excluding the internal feedback signal of unit 37) will be $V_{in}$. Alternatively, filter 45 may be designed to switch itself off upon receiving a large disturbance $\epsilon$. Moreover, filter 45 may short-circuit itself, or may otherwise inhibit the integrating effect, such as using voltage regulation that limits the voltage to a boundary value ($V_{max}$ or $V_{min}$).

The output of forward filter 45 is combined within $V_{in}$ in summing unit 38, and provided to the amplifier unit.

Figure 5A:
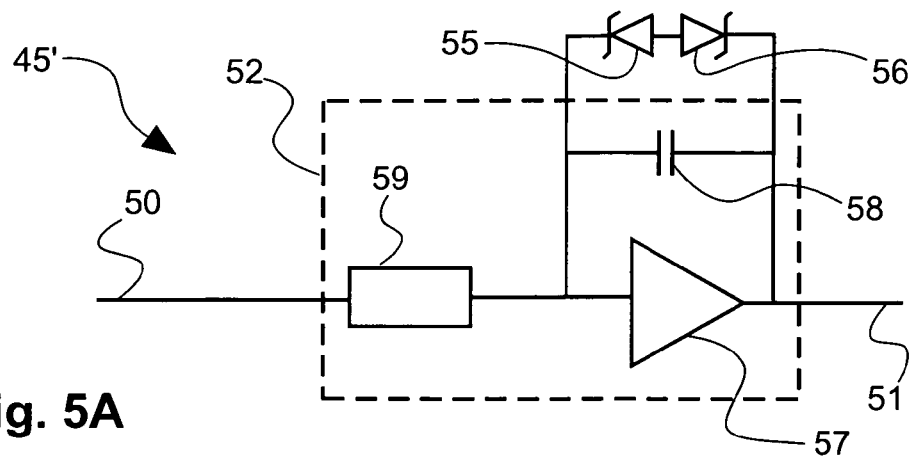
FIG. 5A through 5C describe embodiments of a forward filter unit for use with the invention.
Figure 5B:
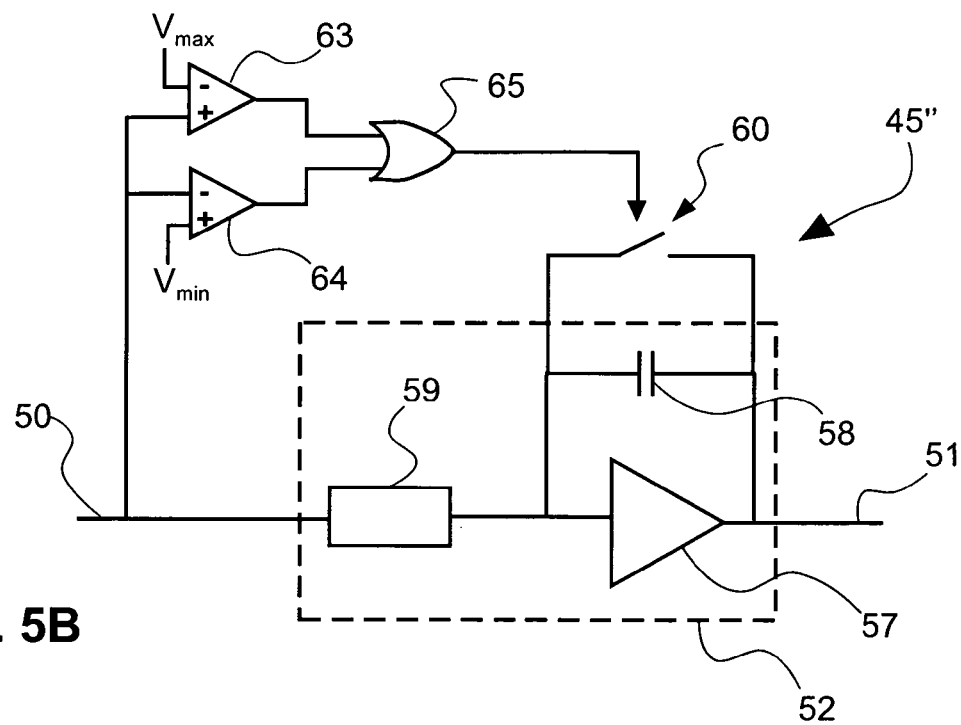
Figure 5C:
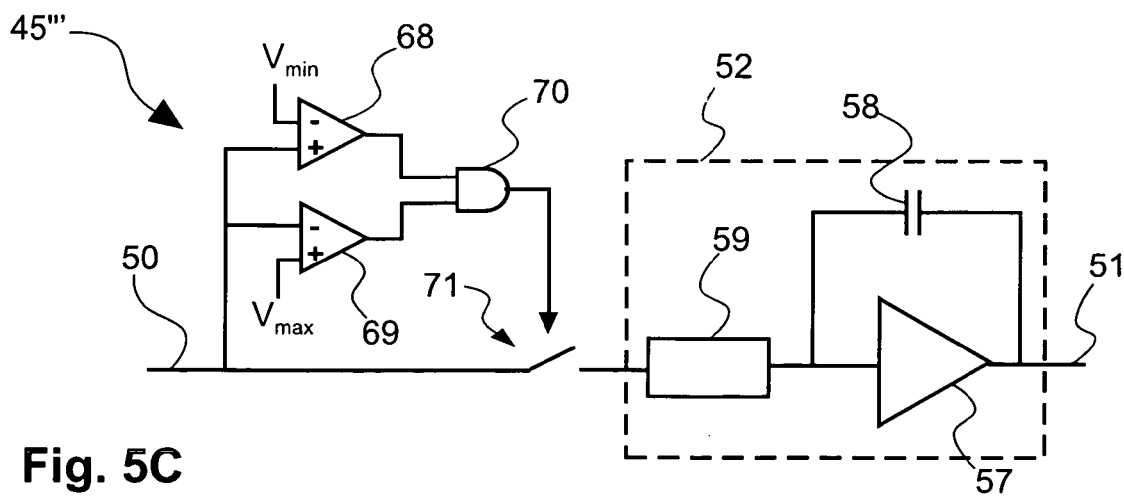

FIGS. 5A through 5C describe three embodiments of forward filter 45, which may be used in combination with the circuit design disclosed in FIG. 4 or any other circuit design corresponding with the teachings of the invention.

In FIG. 5A, a schematic illustration is provided of forward filter 45'. This unit may be used to replace unit 45 of FIG. 4. FIG. 5A illustrates input 50 and output 51 of forward filter 45'. As a basic building block, forward filter 45' comprises an active integrator block 52. This integrator block comprises an operational amplifier 57 with a capacitor 58 placed around it. A resistor 59 is placed in series with operational amplifier 57 and capacitor 58. The basic block 52 is a straightforward layout of an active integrating unit known to the skilled person. Parallel to capacitor 58, forward filter unit 45 comprises two zener-diodes 55 and 56. If the zener-voltage of zener-diodes 55 and 56 are properly selected (preferably slightly above the regular voltage level of the disturbances in disturbance signal $\epsilon$, the zener-diodes 55 and 56 regulate the voltage at output 51 of the forward filter 45'. In particular, once the error term $\epsilon$ becomes large as a result of overmodulation of amplifier unit 37 in FIG. 4, zener-diodes 55 and 56 will limit the voltage across operational amplifier 57 at the zener-voltage. At the output 51, there will thus be provided a DC-signal having its voltage fixed at the zener-voltage until $\epsilon$ is again within its normal operational range. The integrating effect of forward filter 45' is thereby disabled for the duration of overmodulation.

In FIG. 5B, a further embodiment of a forward filter 45" is schematically illustrated. Forward filter unit 45" comprises input 50 and output 51. Again, the basic building block of forward filter 45" is a regular integrated unit 52, comprising an operational amplifier 57, a capacitor 58 parallel to the operational amplifier 57 between its output and inverting input, and a resistor 59 in series with the operational amplifier 57 and capacitor 58.

Forward filter unit 45" further comprises a switch 60 which is operated by a signal provided by a logical OR-gate 65. The input to the logical OR-gate 65 is provided by two comparator circuits 63 and 64 which compare the input signal on input 50 with a maximum voltage $V_{max}$ and minimum voltage $V_{min}$ respectively. If the error term $\epsilon$ exceeds the maximum voltage $V_{max}$, or drops below the minimum (negative) voltage level $V_{min}$, the output signal on OR-gate 65 becomes high, driving the switch 60 in the closed position. This short circuits the capacitor 58 disabling and resetting the forward unit filter 45". The order of the integrating forward filter 45" is thus decreased by taking away the integrating effect of the forward filter 45" upon receiving a disturbance signal $\epsilon$ having a voltage level that exceeds the threshold ($V_{max}$ and $V_{min}$).

Another alternative embodiment of forward filter unit 45 of FIG. 4 is presented in FIG. 5C. FIG. 5C illustrates schematically integrating forward filter block 45'''. Filter unit 45''' comprises input 50 and output 51. The basic building block of forward filter unit 45''' is an integrating filter block 52, such as the active integrating circuit illustrated in FIG. 5C. In the present embodiment, it comprises an operational amplifier 57 in parallel with a capacitor 58, and a resistor 59 in series therewith.

The input signal on input 50 of forward filter unit 45''' is also provided to comparator circuits 68 and 69 which compare this signal with voltage levels $V_{min}$ and $V_{max}$ respectively. The outputs of circuits 68 and 69 are provided as input to logical AND-port 70. In operation, when the input signal on input 50, i.e. the disturbance signal $\epsilon$, is within limits of $V_{mm}$ and $V_{max}$ both outputs of circuits 68 and 69 respectively will be high, resulting in the output of logical AND-port to become high.

This will cause closing of switch 71, resulting in the control loop 44 of FIG. 4 to be closed through forward filter unit 45'''.

In other words, under normal conditions when the error term $\epsilon$ is relatively small, the switch 71 will be closed and the circuit operates normally. If the input signal $\epsilon$ on input 50 of forward filter unit 45''' is larger than $V_{max}$ or smaller than $V_{min}$, at least one the outputs of circuits 68 and 69 is low, resulting in the AND-port 70 to provide a low output. This causes the switch 71 to remain in the open position, disabling forward filter unit 45''' of FIG. 5C, and thereby disabling the integrating feedback loop 44 of FIG. 4.

Although in each of the embodiments illustrated in FIGS. 5A through 5C, the basic building block of the forward filter unit is an active integrating filter block 52, the person skilled in the art will appreciate that this may be embodied by any other integrating filter block, or any other filter block suitable for increasing the loop gain of a class D self-oscillating amplifier unit. Moreover, even though the embodiments of FIGS.

5A through 5C disclose a first order integrating filter unit, this may be replaced by any higher order integrating filter unit for further increasing loop gain.

Most of the embodiments disclosed rely on disabling the functioning of the forward filter, in particular of the integrator. It will be appreciated that in response to receiving an error signal from a deviation detection unit, the benefits of the invention may to some extend be achieved by reducing the gain of the integrator, or by clamping or reducing the input signal to the integrator, for reducing the influence of the control loop in the overall amplification device.

The teachings of the present invention have been explained in connection with self-oscillating class D amplifiers, as mentioned above. It is noted here that these teachings may be applied to class D amplifiers that are not designed to be operating in a self oscillating mode, i.e. wherein the lead-lag compensation network is not present and a periodic reference signal is applied to the zero-crossing detector for providing a pulse width modulated signal. The present invention, applied to such an amplifier, has the effect of stabilising operation of such a non-self-oscillating class D amplifier.

In the previous detailed description, for purposes of explanation and not limitation, example embodiments disclosing specific details have been set forth in order to provide a thorough understanding of embodiments according to the present teachings. However, it will be apparent to one having ordinary skill in the art having had the benefit of the present disclosure that other embodiments according to the present teachings that depart from the specific details disclosed herein may remain within the scope of the appended claims. Moreover descriptions of well-known apparati and methods may have been omitted so as not to obscure the description of the example embodiments. Such methods and apparati are clearly within the scope of the present teachings.

The invention claimed is:

1. An amplification device, comprising:
a device input for receiving a device input signal;
an amplifier unit comprising a zero crossing detector unit, an output filter and a lead-lag compensation network, said zero crossing detector unit being arranged for comparing said device input signal with a reference potential and for switching a pulse width modulated detector output signal between a first voltage level and a second voltage level dependent on said comparison, wherein said amplifier unit is arranged for providing an actual device output signal, said actual device output signal being an amplified representation of said device input signal; and
a device output for providing said actual device output signal;
wherein said amplification device further comprises a control loop placed around said amplifier unit and comprising a forward filter for increasing loop gain for improving a signal-to-noise ratio of said actual device output signal, said forward filter comprising an integrating filter; and
an adder provided within the control loop between the output of the forward filter and the amplifier unit, the device input signal being connected to the adder,
the amplifier unit having a first transfer function, and
the zero crossing detector comprising a deviation filter having a second transfer function, such that the second transfer function mimics the first transfer function.

2. The amplification device according to claim 1, wherein said device is arranged for at least one of disabling said forward filter and reducing functioning of said forward filter upon occurrence of over modulation of said amplifier unit.

3. The amplification device according to claim 1, wherein for disabling said forward filter, said deviation detection unit and said control loop are arranged for providing a filter input signal to said forward filter such as to drive said forward filter in saturation upon occurrence of over modulation of said amplifier unit.

4. The amplification device as in claim 3, wherein said deviation detection unit comprises a detection filter arranged for receiving said device input signal, and for modifying said device input signal such as to provide an expected device output signal corresponding to said actual device output signal of said amplifier unit.

5. The amplification device according to claim 4, wherein said deviation detection unit or said control loop is arranged for comparing said expected device output signal with said actual device output signal, and for providing an error signal upon deviation of said expected device output signal from said actual device output signal.

6. The amplification device according to claim 5, wherein said deviation detection unit is connected such as to couple said expected device output signal into said control loop for providing said error signal to said forward filter.

7. The amplification device according to claim 6, wherein said control loop comprises a subtraction unit for combining said expected device output signal with said actual device output signal, for providing said error signal as a difference signal between said expected device output signal and said actual device output signal.

8. The amplification device as in claim 3, wherein said forward filter is dimensioned such as to saturate upon providing a forward filter output signal in response to said error signal, which forward filter output signal has a voltage level that exceeds a saturation threshold.

9. The amplification device according to claim 8, wherein said forward filter is dimensioned such that said saturation threshold is minimized.

10. The amplification device as in claim 1, wherein said amplifier unit further comprises a correction feedback loop for reducing disturbance caused by said comparator.

11. The amplification device as in claim 1, wherein said forward filter comprises a signal operated switch, said signal operated switch being responsive to a forward filter input signal provided to said forward filter.

* * * * *